United States Patent
Liu (10) Patent No.: US 6,432,609 B1
(45) Date of Patent: Aug. 13, 2002

(54) PHOTOACID GENERATORS, PHOTORESISTS CONTAINING THE SAME, AND METHOD OF UNDERGOING A PHOTOACID-CATALYZED REACTION IN A RESIN SYSTEM USING THE SAME

(75) Inventor: Jui-Hsiang Liu, Tainan (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/621,632

(22) Filed: Jul. 21, 2000

(51) Int. Cl.$^7$ ............................................... G03F 7/004
(52) U.S. Cl. ...................... 430/270.1; 430/919; 522/65
(58) Field of Search ............... 430/270.1, 919; 522/65

(56) References Cited

U.S. PATENT DOCUMENTS

| | | | |
|---|---|---|---|
| 3,325,568 A | * 6/1967 | Richter ........................ | 260/930 |
| 5,100,762 A | * 3/1992 | Tanaka et al. ............... | 430/270 |
| 5,296,332 A | 3/1994 | Sachdev et al. ............. | 430/270 |

FOREIGN PATENT DOCUMENTS

WO    WO-9205164    * 2/1992

OTHER PUBLICATIONS

CA 130:177248, Junega et al.*
CA 114:121660, Wakselman et al.*
CA 117:181823, Oikawa et al. JP 4107460.*
CAPLUS Abs. 1999:190396.*

* cited by examiner

*Primary Examiner*—Rosemary Ashton
(74) *Attorney, Agent, or Firm*—Fish & Richardson P.C.

(57) ABSTRACT

The present invention proposes a novel photoacid generator, and a method of undergoing a photoacid-catalyzed reaction of a resin system, e.g. a curing reaction. The photoacid generator has the following structure of formula (I) wherein R' and R are radicals which enable the photoacid generator (I) forming a compound (II) and a proton acid RH under irradiation:

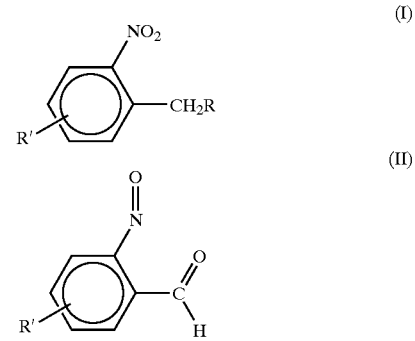

The present invention also discloses positive tone and negative tone photoresists containing the photoacid generator (I).

16 Claims, 1 Drawing Sheet

PHOTOACID GENERATORS, PHOTORESISTS CONTAINING THE SAME, AND METHOD OF UNDERGOING A PHOTOACID-CATALYZED REACTION IN A RESIN SYSTEM USING THE SAME

FIELD OF THE INVENTION

The present invention relates to a novel photoacid generator, a method of changing a structure of a resin with said photoacid generator, particularly a photoresist containing said photoacid generator, and a method of cross-linking a resin using such a photoacid generator.

BACKGROUND OF THE INVENTION

In recent years, industries of Taiwan develop rapidly along with the rise of the information industry, wherein the semiconductor industry bears the brunt of this impact. Along with the rapid development of the semiconductor fabricating processes, the versatility of functions and miniaturization of the products have become the research objectives of the industry. With no doubt, the lithographic techniques are crucial in a semiconductor fabricating process. In brief, the basic steps of the lithography comprise (1) coating a photoresist, (2) exposing, and (3) developing. Firstly, a photoresist is coated on a surface of a chip. Next, a specific light source is irradiated on the photoresist coating through a photomask thereby imagewise exposing the photosensitive material of the photoresist. This step is called "Exposure". Next, a suitable developer is used to remove the exposed or unexposed photoresist. This step is called "Developing". The change of a structure of a polymer contained in the photoresist prior to and after the exposure causes a change in the solubility of the polymer in the developer, creating a soluble region and an insoluble region according the pattern of the photomask, and thus the pattern transfer is achieved.

In general, according to the change of the solubility of the polymer in the developer, photoresists can be classified into positive tone photoresists and negative tone photoresists according to the following:

Positive tone: After exposure, the exposed region has a higher solubility in the developer than the unexposed region.

Negative tone: After exposure, the exposed region has a lower solubility in the developer than the unexposed region.

After decades of R & D, numerous positive tone or negative tone photoresists have been proposed, which includes the free radical polymerization photoresists of diazo and azide types in the early days and the chemical amplication photoresists predominant in the recent market. The reaction mechanisms of the chemical amplication photoresists have diversified from the initial two mechanisms:
(1) photoacid-catalyzed, epoxide-ring-opening cross-linking reaction; and
(2) photoacid-catalyzed, t-butoxycarbonyl (t-BOC) deprotection; to the following reaction mechanisms:
(3) photoacid-catalyzed dehydration;
(4) photoacid-catalyzed rearrangement;
(5) photoacid-catalyzed condensation;
(6) photoacid-catalyzed ionic polymerization;
(7) photoacid-catalyzed depolymerization.

The fundamental principle of a chemical amplication photoresist is utilizing a photoacid generator (PAG), after irridation, to react with a H-donor (usually a solvent or other material) thereby generating a proton acid. In a post-exposure bake (PEB) process following the irridiation, the proton acid initiates a series of chain-breaking, cross-linking or other chemical reactions of a polymer in the photoresist as an acid catalyst, causing a structural change and a difference in solubility to the developer between the exposed region and the unexposed region of the polymer, so that a positive tone or negative tone pattern are obtained. The use of a chemical amplication photoresist, in addition to greatly increasing the sensitivity of the photoresist, also improves the contrast and resolution of the photoresist pattern.

Generally speaking, chemical amplication photoresists, according to the difference in the quantity of the major components, can be classified into binary photoacid photoresists and ternary photoacid photoresists. A binary photoacid photoresist mainly comprises a photoacid generator and a polymeric resin; while a ternary photoacid photoresist mainly comprises a photoacid generator, a dissolution inhibitor or a cross-linking agent, and a polymeric resin. Take the famous t-BOC deprotection photoresist proposed by H. Ito, et al. In U.S. Pat. No. 4,491,628 as an example. This photoresist belongs to a binary photoacid photoresist containing triphenylsulfonium hexafluoroantimonate as the photoacid generator and poly(4-t-butoxycarbonyloxystyrene) (PBOCST) as the polymeric matrix, the reaction mechanism of which is shown in the following Scheme 1:

Scheme 1
Reaction mechanism of photoacid-catalyzed t-BOC deprotection

In Scheme 1, triphenylsulfonium hexafluoroantimonate, upon subjected to UR irradiation, releases a proton acid. The PBOCST, which has a weaker polarity, releases t-butoxycarbonyl (abbreviated as t-BOC) in the presence of an acid catalyst, and forms poly(4-hydroxystyrene) (abbreviated as PHOST) having a higher polarity. In other word, there is a conspicuous difference in solubility between the exposed region and the unexposed region. By selecting an appropriate developer, e.g. a non-polar organic solvent, a negative tone photoresist pattern can be obtained. Alternatively, by using a polar aqueous base as the developer, a positive tone photoresist pattern can be obtained. Since PBOCST and PHOST do not have a high absorbency to UV light at 250 nm, this photoresist is suitable for deep UV lithography. Furthermore, PHOST can be dissolved in an aqueous base. Undoubtedly, this photoacid amplication t-BOC deprotection photoresist is a turning point in the development of photoresists.

Other typical photoresists that contain a photoacid generator are disclosed in U.S. Pat. Nos. 5,585,223; 5,532,106; 5,391,465; 5,296,332; and 5,055,439.

Photoresists not only can be applied in the semiconductor industry, but also have unique applications in other fields. For example, in a photoacid-catalyzed epoxide ring-opening reaction (as shown in Scheme 2) or in a photoacid-catalyzed ionic polymerization reaction, a photoresist can greatly increase the molecular weight of the polymer and receives wide applications in the manufacture of microelectromechanical devices (MEMs). A high level of cross-linking is necessary for forming a pattern with a high aspect ratio in a thick film (>50 micron) by lithography, wherein said aspect ratio is a ratio between the film thickness and the resolution.

Scheme 2
Cross-linking by photoacid-catalyzed epoxide ring-opening reaction

The photoacid-catalyzed dehydration reaction, generally speaking, can be classified into the intermolecular dehydration and the intramolecular dehydration. The reaction mechanism of the intermolecular dehydration is shown in Scheme 3, wherein the photoacid-catalyzed dehydration will cause cross-linking of the polymeric resin of a negative tone photoresist. The intramolecular dehydration reaction (as shown in Scheme 4) is similar to a photoacid-catalyzed reforming reaction (as shown in Scheme 5), both of which will alter the polarity of the polymeric resin. As a result, a polar solvent or a nonpolar solvent can be selected as a developer to obtain a positive tone or a negative tone photoresist pattern.

Scheme 3
Photoresist with photoacid-catalyzed intermolecular dehydration reaction

Scheme 4
Photoresist with photoacid-catalyzed intramolecular dehydration -continued Hydrophilic    Lipophilic Scheme 5
Photoresist with photoacid-catalyzed reforming reaction Hydrophilic    Lipophilic

SUMMARY OF THE INVENTION

One objective of the present invention is to provide a novel photoacid generator.

Another objective of the present invention is to provide a photoresist.

Still another objective of the present invention is to provide a method of carrying out a photoacid-catalyzed reaction in a resin system.

Still another objective of the present invention is to provide a method of photo-cross-linking a resin system.

In order to achieve the above-mentioned objectives, a photoacid generator synthesized according to the present invention has the following structure of formula (I):

(I)

wherein R' and R are radicals which enable the photoacid generator (I) forming and RH under an irradiation, wherein R' is defined as above, and RH is a proton acid.

Preferably, R in the formula (I) is a halogen,

Preferably, R' in the formula (I) is hydrogen, methyl or chloromethyl.

Preferably, R' is hydrogen, when R in the formula (I) is not a halogen.

Preferably, R' is not hydrogen, when R in the formula (I) is halogen.

Preferably, the photocaid generator (I) is 1,4-dichloromethyl-2-nitrobenzene, 2-nitrobenzyl ester of formic acid or 2-nitrobenzyl ester of acetic acid.

The present invention in one aspect also discloses a method of photo-catalyzing a reaction in a resin system with the photoacid generator (I), which comprises subjecting said resin system with an irradiation in the presence of said photoacid generator (I).

Preferably, the reaction undergoing in said resin system is selected from the group consisting of (1) a photoacid-catalyzed, epoxide-ring-opening cross-linking reaction; (2) a photoacid-catalyzed, t-butoxycarbonyl (t-BOC) deprotection reaction; (3) a photoacid-catalyzed dehydration; (4) a photoacid-catalyzed rearrangement; (5) a photoacid-catalyzed condensation; (6) a photoacid-catalyzed ionic polymerization; and (7) a photoacid-catalyzed depolymerization.

Said resin system comprises one or more resins, and one or more components that are required in undergoing said reaction, e.g. a cross-linking agent, a cross-linking promoter and a solvent.

Another aspect of the present invention is a photoresist composition comprising the photoacid generator (I); and a polymer.

Preferably, said photoresist composition further comprises an organic solvent.

The term "polymer" used in the present invention may refer to a homopolymer, a copolymer, or an oligomer.

Still another aspect of the present invention is a method of forming a photoresist pattern on a substrate comprising the following steps:
 a) coating the above-mentioned photoresist composition on a substrate;
 b) imagewise exposing the resulting film in step a) to an irradiation in a pattern;
 c) baking said imagewise exposed film; and
 d) developing said baked film with a developer thereby forming a photoresist pattern on said substrate.

Preferably, said polymer is a homopolymer having a side chain containing a carboxyl group.

Preferably, said polymer is a copolymer having a side chain containing a carboxyl group.

Preferably, said polymer is a homopolymer having a side chain that will form a carboxyl group upon subjected to heating and in the presence of a proton acid.

Preferably, said polymer is a copolymer having a side chain that will form a carboxyl group upon heating and in the presence of a proton acid.

Preferably, said homopolymer is poly(acrylic acid) or poly(methacrylic acid).

Preferably, said copolymer is prepared by copolymerizing acrylic acid or methacrylic acid with one or more monomers containing a vinyl unsaturated group, or said copolymer is a carboxyl-containing graft copolymer prepared by reacting a cyclic anhydride with a hydroxyl-containing polymer or copolymer, wherein the cyclic anhydride and hydroxyl group undergo a ring-opening reaction.

Preferably, the side chain of said homopolymer contains an acid anhydride group or t-butoxycarbonyl group.

Preferably, the side chain of said copolymer contains an acid anhydride group or t-butoxycarbonyl group. More preferably, the side chain of said copolymer further contains a carboxyl group.

Preferably, said copolymer has the following structure:

wherein w and z is an integer greater than 0; x and y are integers equal to or greater than 0.

Preferably, said copolymer has the following structure:

wherein m, x, y and z are integers equal to or greater than 0; and x and z are not 0 at the same time.

Preferably, said photoacid generator is 0.5 to 30% by weight of said polymer in said photoresist composition.

Preferably, the baking in step c) enables an acid-catalyzed dehydration condensation reaction between two carboxyl groups.

Preferably, the baking in step c) enables an acid-catalyzed deprotection of a t-butyl group.

In still another aspect of the present invention, a method of cross-linking a polymer with a photoacid generator is disclosed, wherein said polymer has a carboxyl-containing side chain, or said polymer has a side chain that will form a carboxyl group in the presence of an acid and under heating. Said method comprises subjecting said polymer to an irradiation in the presence of said photoacid generator and subsequently to heating at 120° C.–170° C. Preferably, said photoacid generator has a structure of the above-mentioned formula (I).

DETAILED DESCRIPTION OF THE INVENTION

A photoacid generator usually is used as an acid catalyst in a positive tone photoresist, e.g. a deprotection of t-butoxycarbonyl group on the side chain of a polymer, and a negative tone photoresist, e.g. the epoxide ring-opening cross-linking reaction on the side chain of a polymer. In the present invention, it has been found that a polymer containing a carboxyl functional group, when heated to 130~170° C. under the catalyzation of an acid, will undergo a dehydration reaction of two carboxyl functional groups and form a stable anhydride structure thereby causing cross-linking of the polymer. Different from a common property of a small molecular anhydride (such as acetic anhydride) or a cyclic anhydride (such as maleic anhydride), that is they are easy to hydrolyze in an alkaline aqueous solution, the anhydride structure bridging the side chains of the polymer is rather stable in an alkaline aqueous solution. Therefore, the above-mentioned properties, together with a suitable photoacid generator (PAG), can be used to design various positive or negative tone photoresists with different properties.

Next, in the present invention, three photoacid generators of non-ionic salt are synthesized. The synthesis method thereof is shown in the following Scheme 6. The three photoacid generators, under an irradiation, will generate a proton acid, as shown in Scheme 7. Generally speaking, a photoacid of ionic salt has a good heat resistance and a high quantum yield. However, it has a poor solubility in an organic solvent. On the other hand, a photoacid of non-ionic salt has a good solubility in an organic solvent.

Scheme 6
Synthesis of photoacid generator of non-ionic salt

-continued (1,4-dichloromethyl-2-nitrobenzene)
Non-ionic photoacid A (abbreviated as PAG-A)

(2-nitrobenzyl ester of formic acid)
Non-ionic photoacid B (abbreviated as PAG-B)

(2-nitrobenzyl ester of acetic acid)
Non-ionic photoacid C (abbreviated as PAG-C)

Scheme 7
Reaction mechanism of photoacid generation,
wherein R is —OCOH, —OCOCH₃ or Cl

EXAMPLE 1

Synthesis of 2-nitro-p-xylylene dichloride (PAG-A)

To 10 ml of nitric acid ($HNO_3$) in an ice-water bath 20 ml of concentrated sulfuric acid ($H_2SO_4$) was added dropwise while stirring. 5 g of p-xylene dichloride was then added and the addition was completed within 30 minutes, the resulting mixture was allowed to react at a temperature not to exceeding 35° C. for 2 hours while stirring. The reaction mixture was poured into 100 ml of ice water, and a precipitate was formed. The precipitate was removed therefrom, washed with water, and dissolved in dichloromethane ($CH_2Cl_2$). The solution was washed with sodium hydrogen carbonate ($NaHCO_3$) aqueous solution, and the organic phase was separated therefrom. Anhydrous magnesium sulfate was added to the organic phase ($CH_2Cl_2$) to remove the moisture contained therein. The organic solvent was evaporated from the organic phase after filtration, and the solid was recrystallized with ethanol (EtOH) to obtain 2-nitro-p-xylylene dichloride (PAG-A), a non-ionic photoacid generator. The structure of this compound was identified by IR, NMR and elemental analysis (EA).

EA: $C_8H_7O_2Cl_2$ (206); Calculated value: C, 46.60; H, 3.40; Cl, 34.42; Found: C, 46.57; H, 3.35; Cl, 34.52.

$^1$H-NMR (acetone-d6, ppm): δ4.8 (2H, —$CH_2Cl$), δ5.0 (2H, —$CH_2Cl$ near —$NO_2$), δ7.8 (2H, Ph—H), δ8.1 (1H, Ph—H near —$NO_2$).

EXAMPLE 2

Synthesis of 2-nitrobenzyl Ester of Formic Acid (PAG-B)

5 g of 2-nitrobenzyl alcohol was dissolved in 50 ml of benzene. 10 g of formic acid was added to the solution to carry out esterification at 90° C. for 24 hours. Upon completion of the reaction, the reaction mixture was washed with sodium hydrogen carbonate ($NaHCO_3$) aqueous solution. The organic phase was separated from the aqueous phase, and anhydrous magnesium sulfate was added to the organic phase to remove the moisture contained therein. The organic solvent was evaporated from the organic phase after filtration to obtain 2-nitrobenzyl ester of formic acid (PAG-B), a non-ionic photoacid generator. The structure of this compound was identified by IR, NMR and elemental analysis (EA).

EA $C_8H_7NO_4$ (181); Calculated value: C, 53.04; H, 3.87; N, 7.73; Found: C, 53.12; H, 3.85; N, 7.80.

$^1$H-NMR (acetone-d6, ppm): δ5.5 (2H,PH—$CH_2$—O), δ7.8 (3H, Ph—H), δ8.1 (1H, Ph—H near —$NO_2$), δ8.3 (1H, O=C—H).

EXAMPLE 3

Synthesis of 2-nitrobenzyl Ester of Acetic Acid (PAG-C)

The procedures of Example 2 were repeated except that the formic acid was replaced by acetic acid to obtaining 2-nitrobenzyl ester of acetic acid (PAG-C), a non-ionic photoacid generator. Alternatively, 5 g of 2-nitrobenzyl alcohol was dissolved in 20 g of acetic anhydride to carry out reactions at 70° C. for 6 hours. The reaction product was dissolved in dichloromethane (CH$_2$Cl$_2$), washed with sodium hydrogen carbonate (NaHCO$_3$) aqueous solution, and the organic phase was separated therefrom. Anhydrous magnesium sulfate was added to the organic phase (CH$_2$Cl$_2$) to remove the moisture contained therein. The organic solvent was evaporated from the organic phase after filtration to obtain 2-nitrobenzyl ester of acetic acid (PAG-C), a non-ionic photoacid generator.

EA C$_9$H$_9$NO$_4$ (195); Calculated value: C, 55.38; H, 4.62; N, 7.18;

Found: C, 55.45; H, 4.58; N, 7.23.

$^1$H-NMR (acetone-d6, ppm): δ2.1 (3H, —CH$_3$), δ5.4 (2H,PH—CH$_2$—O), δ7.7 (3H, Ph—H), δ8.1 (1H, Ph—H near —NO$_2$).

EXAMPLE 4

Reactivity of Photoacid Generators Under UV Irradiation

Figure 1:
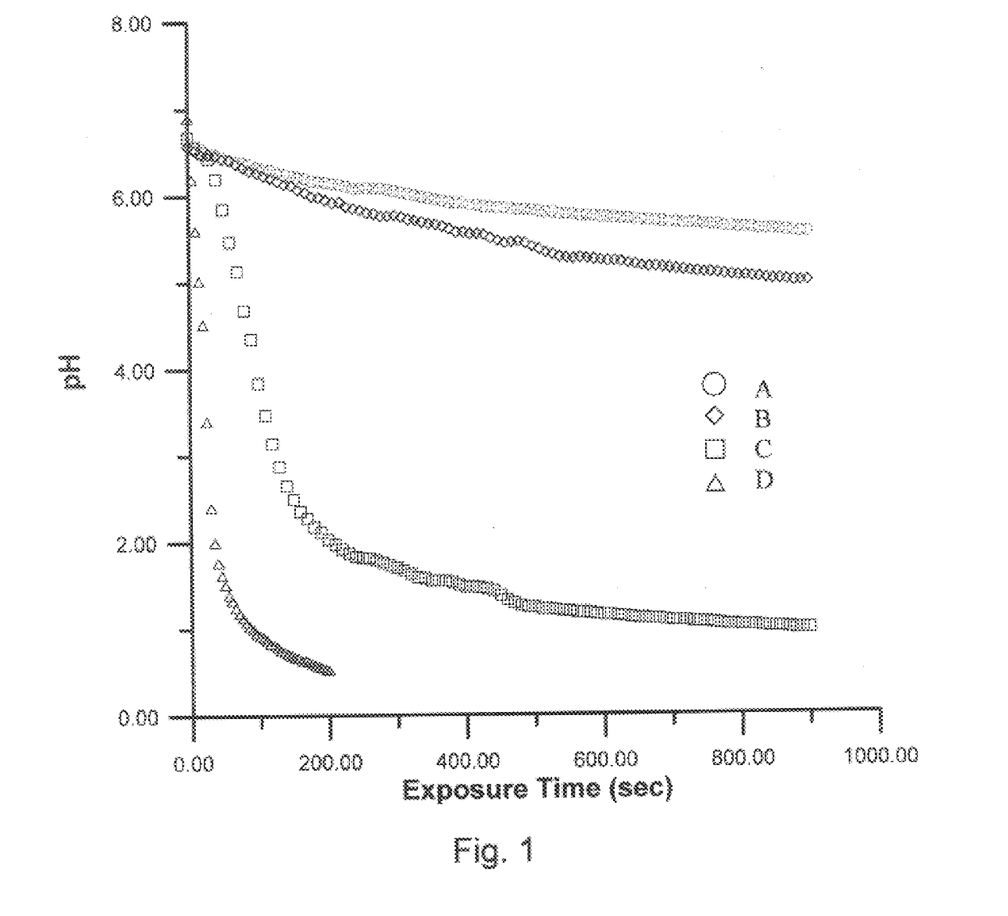
FIG. 1 shows relationships between a pH value of photoacid generators and irradiation time, wherein the legends represent photoacid generators of (a) 2-nitrobenzyl ester of acetic acid (PAG-C) according to the present invention; (b) 2-nitrobenzyl ester of formic acid (PAG-B) according to the present invention; (c) 2-nitro-p-xylylene dichloride (PAG-A) according to the present invention; and (d) a control photoacid generator, triarylsulfonium salt.
Figure 2:
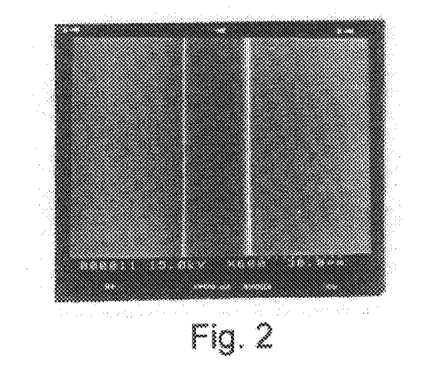
FIG. 2 shows a micrograph showing a resolution of a photoresist pattern by using a positive tone photoresist prepared in Example 12 according to the present invention, wherein the photoresist pattern was developed in 2% tetramethyl ammonium hydroxide (TMAH) aqueous solution for 30 seconds.

The methanol solutions of photoacid generators A, B and C were subjected to UV irradiation. The variations of the pH value of the solutions along with the UV irradiation time are shown in FIG. 1, wherein from the top to the bottom, the pH values of the photoacid (a) PAG-C, (b) PAG-B, (c) PAG-A and (d) a control photoacid generator triarylsulfonium salt are shown. The pH values reduce rapidly when the UV irradiation time increases, which indicates a continuous formation of an acid during the UV irradiation.

As described hereinbefore, an ionic salt photoacid generator has a higher quantum yield, therefore, upon subjected to an UV irradiation, will generate a greater acidity than a non-ionic salt photoacid. However, an ionic photoacid generator has a poor solubility in an organic solvent, so that it is not suitable to be used in an organic resin system. A photoacid generator synthesized according to the present invention is a non-ionic salt photoacid generator, and thus has a good solubility in an organic solvent.

EXAMPLE 5

Photoacid Amplication Negative Tone Photoresist 6 g of poly(methacrylic acid) was dissolved in 5 g of methanol followed by adding 0.08 g of photoacid generator PAG-A to the resulting solution to prepare a photoresist. A film of the photoresist was formed on a wafer by spin coating (1000 r.p.m. 20 sec; 2500 r.p.m. 20 sec). The film was exposed to a UV light by using a suitable mask for 10 seconds; then was subjected to a post-exposure baking (PEB) in an oven at 150° C. for 10 minutes. 10 wt % sodium hydrogen carbonate solution was used to develop a pattern as fine as 2 μm, wherein the unexposed portion was dissolved. Other suitable developers include, for example, methanol aqueous solution, tetramethylammonium hydroxide (TMAH) aqueous solution, sodium carbonate and sodium hydrogen carbonate aqueous solution.

Depending on the composition of the photoresist, an appropriate exposure time ranges between 10 to 20 seconds, the PEB time and temperature range between 10 to 20 minutes and between 130 to 170° C., respectively.

Control Example 1

Not Using Photoacid Generator

The procedures of Example 5 were repeated without an addition of the PAG-A in the preparation of the photoresist. No pattern was formed after the same procedures of coating, exposing, and developing.

Example 5 and Control Example 1 indicate that a resin with a side chain thereof containing carboxyl groups can be cross-linked by irradiating and heating in the presence of a photoacid generator.

EXAMPLE 6

Photoacid Amplication Negative Tone Photoresist

The procedures of Example 5 were repeated except that the PAG-A was replaced by PAG-B and PAG-C. The results show that patterns imagewise corresponding to those of the photomasks used can also be formed.

EXAMPLE 7

Various Photoacid Amplication Negative Tone Photoresists

Various photoacid amplication negative tone photoresists can be prepared as in Example 5 by replacing poly (methacrylic acid) with poly(acrylic acid), poly(vinyl alcohol) (PVA), or a copolymer of (meth)acrylic acid monomer and a co-monomer such as an acrylic acid derivative (e.g. methyl methacrylate (MMA), butyl methacrylate (BMA), etc.) or a co-monomer containing a vinyl unsaturated group (e.g. ethylene, styrene, vinyl alcohol, vinyl acetate, etc.). Taking a copolymer containing methacrylic acid as an example, a general cross-linking reaction thereof is shown in the following Scheme 8, wherein R is a co-monomer.

Scheme 8
Photoacid-catalyzed cross-linking reaction of a copolymer containing methacrylic acid

EXAMPLE 8

Forming a Carboxyl-containing Graft Copolymer by Ring-opening of Cyclic Anhydride with Hydroxy Group on the Side Chain

Firstly, a copolymer of p-hydroxyl styrene and methyl methacrylate was synthesized. p-Hydroxyl styrene and methyl methacrylate in equal moles were co-polymerized in THF solvent in the presence of 1 wt % azoisobutyronitrile (AIBN) for 2 hours. The reaction mixture was then trickled into water, and a precipitate was formed. Next, the copolymer was dissolved in THF, and an appropriate amount of butanedioic anhydride was then added to carry out the reaction at 70° C. for 24 hours, thereby forming a carboxyl-containing graft copolymer as shown in Scheme 9.

1.5 g of the resulting graft copolymer was dissolved in 1 g of THF solvent, and 0.02 g of a photoacid generator was added to prepare a photoresist. The photoresist was spun coated (1000 r.p.m. 20 sec; 2500 r.p.m. 20 sec) on a wafer. The resulting film was exposed to a UV light by using a suitable mask for 10 seconds; then the wafer was placed in an oven at 130~170° C. for post-exposure baking (PEB) for 20~60 minutes in order to carry out a cross-linking reaction as shown in Scheme 9. A suitable developer, e.g. methanol aqueous solution (0~100%), TMAH aqueous solution, sodium carbonate or sodium hydrogen carbonate aqueous solution, was used to dissolve the unexposed portion thereby obtaining a photoresist pattern having a good resolution.

Scheme 9
Grafting butanedioic acid anhydride to copolymer of p-hydroxyl styrene and methyl methacrylate, and the cross-linking reaction thereof

It is apparent that the methyl methacrylate (MMA) monomer can be replaced by another acrylic acid derivative, such as methacrylic acid (MAA), acrylic acid (AA), butyl methacrylate (BMA), etc., or a monomer containing vinyl unsaturated group, such as ethylene, styrene, vinyl alcohol, vinyl acetate, etc. in the preparation of the co-polymer, and thus photoresists containing various copolymers can be prepared.

EXAMPLE 9

Forming a Carboxyl-containing Graft Copolymer by Ring-opening of Cyclic Anhydride with Poly (vinyl Alcohol)

10 g of vinyl alcohol in 30 g of THF solvent was polymerized in the presence of 0.1 g of AIBN for a few hours. Then, the reaction mixture was trickled into ether, and a precipitate of poly(vinyl alcohol) was formed. The poly (vinyl alcohol) was dissolved in THF and an appropriate amount of butanedioic anhydride was added to carry out a reaction at 70° C. for 24 hours, thereby forming a carboxyl-containing graft copolymer, as shown in Scheme 10. 1.5 g of the graft polymer was dissolved in 1 g of methanol, 0.02 g of a photoacid generator was added to the resulting solution to prepare a photoresist. The photoresist was spun coated (1000 r.p.m. 20 sec; 2500 r.p.m. 20 sec) on a wafer. The resulting film was exposed to 20 a UV light by using a mask; then was subjected to PEB in an oven at 130~170° C. for 20~60 minutes in order to carry out a cross-linking reaction as shown in Scheme 10. A suitable developer, e.g. methanol aqueous solution (0~100%), TMAH aqueous solution, sodium carbonate or sodium hydrogen carbonate aqueous solution, was used to dissolve the unexposed portion thereby obtaining a photoresist pattern transferred from the mask used.

Scheme 10
Grafting butanedioic acid anhydride to poly(vinyl alcohol) and cross-linking reaction thereof

Since poly(vinyl alcohol) per se is a water soluble polymer and the carboxyl group is soluble in an aqueous base, and the cross-linked portion is insoluble in water and aqueous base, therefore the poly(vinyl alcohol) negative tone photoresist is water-developable. Similarly, a copolymer of vinyl alcohol and a vinyl unsaturated monomer also can be used to prepare a photoacid amplication negative tone photoresist.

EXAMPLE 10

Carboxyl-containing Graft Copolymer Formed by Ring-opening of Cyclic Anhydride and Phenolic Resin

As shown in Scheme 11, a phenolic resin and a cyclic anhydride were dissolved in THF to carry out a ring-opening reaction at 70° C. for 6 hours thereby forming a carboxyl-containing graft copolymer. Said copolymer and a photoacid generator were used to prepare a photoresist. Since the carboxyl group is soluble in an aqueous base, and the photo-irradiated and baked cross-linked portion is insoluble in the aqueous base, therefore such a photoresist is a negative tone photoresist.

Scheme 11
Negative tone photoresist of phenolic resin soluble in alkaline aqueous solution

-continued

Similar to Scheme 11, various phenolic resins, together with a photoacid generator, can be used to prepare negative tone photoresists as shown in Scheme 12. In Scheme 12, R can be a special functional group, such as methyl, ethyl, borneol, etc., thereby improving the photoresist properties.

Scheme 12
Bis-A phenolic resin negative tone photoresist

EXAMPLE 11

Negative Tone Photoresists of Various Copolymers

Copolymers were obtained by copolymerizing monomers of MAA, MMA, α-methacryloxy-γ-butyrolactone (MABL) and tert-Butyl methacrylate in different ratios in tetrahydrofuran (THF) in the presence of 1 wt % AIBN at 60° C. for 12 h. The reaction mixtures were trickled into mixed solutions of water/methanol (1:1 in volume), and copolymers having the following structure were precipitated:

wherein the molar ratio of w, x, y and z is:

| W | X | Y | Z |
|---|---|---|---|
| 1 | 1 | 1 | 1 |
| 1 | 1 | 1 | 0 |
| 1 | 1 | 0 | 0 |
| 1 | 0 | 0 | 0 |

1.5 g of said copolymer and 0.15 g of a photoacid generator were dissolved in 10 ml THF solvent to prepare a negative tone photoresist.

EXAMPLE 12

Positive Tone Photoresists

Copolymers, made by copolymerizing maleic anhydride, MMA, tert-butyl methacrylate, bornyl methacrylate monomers in different ratios, were mixed with a photoacid generator in an organic solvent to prepared photoresists. The photoresists were coated on substrates by spinning coating, imagewise exposed to a UV by using masks, and were subjected to PEB at 80~100° C., wherein the t-butyl of the tert-butyl methacrylate dissociated, as shown in Scheme 13. The photoresists, after developing, showed positive tone photoresist patterns. The non-exposed portions of the patterns were again subjected to a high temperature treatment at 120° C. to form cross-linked structures resulting from the acid-catalyzed dehydration of carboxyl groups, thereby greatly enhancing the properties of the photoresist pattern.

After being imagewise exposed for 10 seconds, the film was post-baked at 170° C. for 10 minutes, and developed in a 6% sodium hydrogen carbonate solution, thereby obtaining a negative tone photoresist pattern. This is accomplished by the cross-linking reaction of the carboxyl group catalyzed by the photoacid during the high temperature baking.

What is claimed is:

1. A photoresist composition comprising a polymer and a photoacid generator having the following formula (I):

The following Examples 13 and 14 will illustrate that a same composition can be used to make a positive tone photoresist or a negative tone photoresist.

EXAMPLE 13

A copolymer was prepared by copolymerizing maleic anhydride, MMA, tert-butyl methacrylate, and (+)-bornyl methacrylate in a molar ratio of 1:1:3:1. 1 g of said copolymer and a photoacid generator ($9.0 \times 10^{-2}$ g) were dissolve in 10 ml of THF. The solution, after being filtered with a 0.45 μm membrane, was spun-coated on a substrate to form a film and pre-baked at 80° C. for 3 minutes. After being imagewise exposed for 10 seconds, the film was post-baked at 100° C. for 10 minutes, and developed in a 6% sodium hydrogen carbonate solution, thereby obtaining a positive tone photoresist pattern. This is accomplished by the dissociation of the t-butyl catalyzed the photoacid during the post-exposure baking.

EXAMPLE 14

A photoresist having the same composition as the photoresist prepared in Example 13 was spun-coated on a substrate to form a film, and pre-baked at 80° C. for 3 minutes.

wherein R' and R are radicals which enable the photoacid generator (I) forming and RH upon irradiation, wherein R' is defined as above, and R is a halogen, provided that the photoacid generator (I) is not 2-nitrobenzyl ester of acetic acid.

2. The photoresist composition according to claim 1, wherein R' in the formula (I) is hydrogen, methyl or chloromethyl.

3. The photoresist composition according to claim 2, wherein R' is hydrogen, when R in the formula (I) is not a halogen.

4. The photoresist composition according to claim 2, wherein R' is not hydrogen, when R in the formula (I) is halogen.

5. The photoresist composition according to claim 1, wherein the photoacid generator (I) is 1,4-dichloromethyl-2-nitrobenzene, or 2-nitrobenzyl ester of formic acid.

6. The photoresist composition according to claim 1, wherein said polymer is poly(acrylic acid) or poly(methacrylic acid).

7. The photoresist composition according to claim 1, wherein said polymer is a copolymer having a side chain containing a carboxyl group.

8. The photoresist composition according to claim 1, wherein said polymer is a homopolymer having a side chain that will form a carboxyl group upon heating and in the presence of a proton acid wherein the side chain of said homopolymer contains an acid anhydride group or t-butoxycarbonyl group.

9. The photoresist composition according to claim 1, wherein said polymer is a copolymer having a side chain that will form a carboxyl group upon heating and in the presence of a proton acid wherein the side chain of said copolymer contains an acid anhydride group or t-butoxycarbonyl group.

10. The photoresist composition according to claim 9, wherein the side chain of said copolymer further contains a carboxyl group.

11. The photoresist composition according to claim 10, wherein said copolymer has the following structure:

wherein w and z are an integer greater than 0; x and y are integers equal to or greater than 0.

12. The photoresist composition according to claim 9, wherein said polymer has the following structure:

wherein m, x, y and z are integers equal to or greater than 0; and x and z are not 0 at the same time.

13. The photoresist composition according to claim 1, wherein said copolymer is prepared by copolymerizing acrylic acid or methacrylic acid with one or more monomers containing a vinyl unsaturated group, or said copolymer is a carboxyl-containing graft copolymer prepared by reacting a cyclic anhydride with a hydroxyl-containing polymer or copolymer, wherein the cyclic anhydride and hydroxyl group undergo a ring-opening reaction.

14. The photoresist composition according to claim 1, wherein said photoacid generator is 0.5 to 30% by weight of said polymer in said photoresist composition.

15. The photoresist composition according to claim 1 further comprising an organic solvent.

16. A photoresist composition comprising a polymer and a photoacid generator having the following formula (I):

wherein R' and R are radicals which enable the photoacid generator (I) forming and RH upon irradiation, wherein R' is defined as above, and R is a halogen, wherein said polymer is selected from the group consisting of a homopolymer having a side chain containing a carboxyl group, a homopolymer having a side chain that will form a carboxyl group upon subjected to heating and in the presence of a proton acid, and a copolymer having a side chain that will form a carboxyl group upon heating and in presence of proton acid, provided that the photoacid generator (I) is not 2-nitrobenzyl ester of acetic acid.

* * * * *